United States Patent [19]
Saia et al.

[11] Patent Number: 5,736,448
[45] Date of Patent: Apr. 7, 1998

[54] FABRICATION METHOD FOR THIN FILM CAPACITORS

[75] Inventors: Richard Joseph Saia, Schenectady; Kevin Matthew Durocher, Waterford; Bernard Gorowitz, Clifton Park, all of N.Y.

[73] Assignee: General Electric Company, Schenectady, N.Y.

[21] Appl. No.: 566,616

[22] Filed: Dec. 4, 1995

[51] Int. Cl.$^6$ ................................................. H01L 21/20
[52] U.S. Cl. .................. 438/393; 438/623; 438/637; 438/656; 438/780
[58] Field of Search ................................. 438/393, 623, 438/637, 656, 780

[56] References Cited

U.S. PATENT DOCUMENTS

| | | | |
|---|---|---|---|
| 4,376,329 | 3/1983 | Behn | 427/41 |
| 4,378,382 | 3/1983 | Behn | 427/9 |
| 4,481,283 | 11/1984 | Kerr et al. | 438/396 |
| 4,508,049 | 4/1985 | Behn et al. | 427/41 |
| 4,603,059 | 7/1986 | Kiyosumi et al. | 438/396 |
| 5,036,020 | 7/1991 | Tigelaar | 438/396 |
| 5,250,451 | 10/1993 | Chouan | 438/161 |
| 5,262,201 | 11/1993 | Chandra et al. | 427/376.2 |
| 5,480,686 | 1/1996 | Rudder et al. | 427/562 |
| 5,516,500 | 5/1996 | Liu et al. | 423/446 |
| 5,563,762 | 10/1996 | Leung et al. | 438/396 |
| 5,569,487 | 10/1996 | De Vre et al. | 427/81 |
| 5,576,925 | 11/1996 | Gorowitz et al. | 361/301.2 |
| 5,638,251 | 6/1997 | Goel et al. | 361/313 |

FOREIGN PATENT DOCUMENTS

| | | |
|---|---|---|
| 202806 | 2/1988 | Japan. |
| A1202806 | 8/1989 | Japan. |
| 314218 | 2/1991 | Japan. |

OTHER PUBLICATIONS

"Advanced Materials for High Energy Density Capacitors" By SJ Rzad, et al 1993 IEEE 35th International Power Sources Symposium, Jun. 22–25, 1992, pp. 358–362.

"A New High Temperature Multilayer Capacitor With Acrylate Dielectrics" By Angelo Yializis, et al, IEEE Dec. 1990, vol. 13, No. 4, pp. 611–615.

"Dielectric Properties of Carbon Films From Plasma Enhanced Chemical Vapor Deposition", by J. L. Davidson, et al, Proc Electrochem. Soc. vol. 89–12, pp. 306–316.

"Multilewvel DLC (Diamondlike Carbon) Capacitor Structure", JL Davidson et al, SPIE vol. 871, Space Structures, Power & Power Conditioning (1988) pp. 308–312.

*Primary Examiner*—Charles L. Bowers, Jr.
*Assistant Examiner*—Toniae M. Thomas
*Attorney, Agent, or Firm*—Ann M. Agosti; Marvin Snyder

[57] ABSTRACT

A capacitor is fabricated on a base surface by applying a first pattern of electrical conductors (a first capacitor plate) over the base surface with an outer surface of the first pattern of electrical conductors including molybdenum. A first hard portion of a capacitor dielectric layer including amorphous hydrogenated carbon is deposited over the first capacitor plate and the base surface, a soft portion of the capacitor dielectric layer is deposited over the first hard portion, and a second hard portion of the capacitor dielectric layer is deposited over the soft portion. The deposition of the soft portion occurs at a lower bias voltage than the deposition of the first and second hard portions. A second pattern of electrical conductors (a second capacitor plate) is applied over the capacitor dielectric layer which is then patterned. A polymer layer is applied over the first and second capacitor plates, and two vias are formed, a first via extending to the first capacitor plate and a second via extending to the second capacitor plate. An electrode-coupling pattern of electrical conductors is applied over the polymer layer, a first portion extending into the first via and a second portion extending into the second via. Deposition of the capacitor dielectric layer can include using a methylethylketone precursor. Additional capacitor dielectric layers and plates having staggered via landing pads can be layered to increase the capacitance.

7 Claims, 8 Drawing Sheets fig. 1 fig. 2 fig. 3 fig. 4 fig. 5a fig. 5b fig. 6 fig. 7 fig. 8 fig. 9 fig. 10 fig. 11

FABRICATION METHOD FOR THIN FILM CAPACITORS

BACKGROUND OF THE INVENTION

In one form of high density interconnect (HDI) circuit module, an adhesive-coated polymer film overlay having via openings covers a substrate which can support integrated circuit chips in chip wells. The polymer film provides an insulated layer upon which is deposited a metallization pattern for interconnection of substrate metallization and/or individual circuit chips through the vias. Methods for performing an HDI process using overlays are further described in Eichelberger et al., U.S. Pat. No. 4,783,695, issued Nov. 8, 1988, and in Eichelberger et al., U.S. Pat. No. 4,933,042, issued Jun. 12, 1990. Generally a plurality of polymer film overlays and metallization patterns are used. Capacitors are needed for a variety of packaging applications utilizing the HDI fabrication process technology. Conventionally, capacitors are incorporated into the substrates of HDI modules as chips.

In another form of circuit module fabrication, as described by Cole et al., "Fabrication and Structures of Circuit Modules with Flexible Interconnect Layers," U.S. application Ser. No. 08/321,346, filed Oct. 11, 1994, a method for fabricating a circuit module includes using a flexible interconnect layer having a metallized base insulative layer and an outer insulative layer. At least one circuit chip having chip pads is attached to the base insulative layer and vias are formed in the outer and base insulative layers to expose selected portions of the base insulative layer metallization and the chip pads. A patterned outer metallization layer is applied over the outer insulative layer extending through selected ones of the vias to interconnect selected ones of the chip pads and selected portions of the base insulative layer metallization.

SUMMARY OF THE INVENTION

It would be advantageous to have a reliable fabrication method and structure of capacitors incorporated on base surfaces because, for example, if thin film integral capacitors replace chip capacitors, additional space in a substrate or on a flexible layer would be available for chips other than capacitors. Fabrication of capacitors on upper HDI polymer layers calls for (a) thin film capacitor materials which do not produce significant topography changes in overlying layers; (b) capacitor materials which can be deposited at temperatures below about 190° C.; (c) a process for patterning the capacitor compatible with exposed HDI materials; (d) capacitor materials which have thermal stability; (e) a good voltage rating and capacitance; and (f) a good adhesion of capacitor dielectric material to underlying capacitor plates.

Many high dielectric constant thin film materials such as crystalline $BaTiO_3$ cannot be used to fabricate capacitors on the upper level overlays because the high processing temperatures required (about 600° C.) are not compatible with conventional HDI materials such as polyimides and adhesives which are preferably kept at temperatures below about 190° C.

Amorphous hydrogenated carbon (commonly referred to as diamond-like carbon or DLC) can be deposited at temperatures below 100° C. A limitation of DLC, however, has been poor adhesion to many underlying materials, particularly to metals such as aluminum, copper, titanium, and gold.

The present invention includes structures and methods of incorporating thin film capacitors on polymer layers such as those in laminated HDI multichip modules and in flexible interconnect layers with good adhesion. The capacitors can be fabricated using interconnect metallization (titanium coated with copper coated with titanium) as the lower capacitor plate, DLC as the capacitor dielectric material, and a sputtered metallization layer as the upper capacitor plate. Good adhesion of DLC to a capacitor plate is obtained with a thin molybdenum adhesion layer and a pressure graded DLC deposition using an organic precursor including oxygen. These integral capacitors can be fabricated using a fabrication process compatible with conventional HDI and flexible interconnect materials.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

FIGS. 1–5b are views illustrating a process for fabricating an integral thin film capacitor on a polymer layer.

DETAILED DESCRIPTION OF A PREFERRED EMBODIMENT OF THE INVENTION

Figure 3:
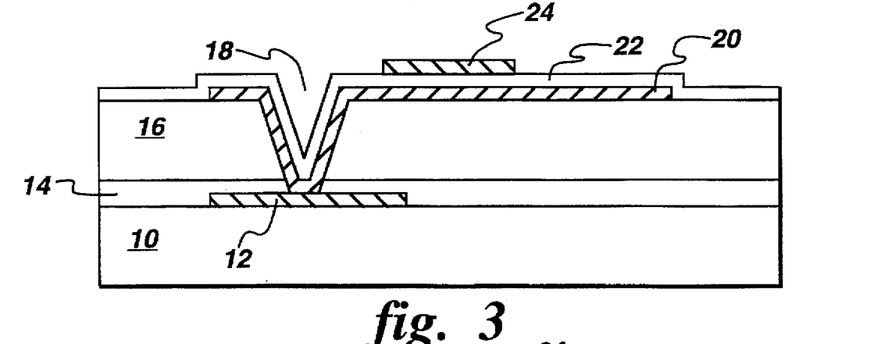
Figure 4:
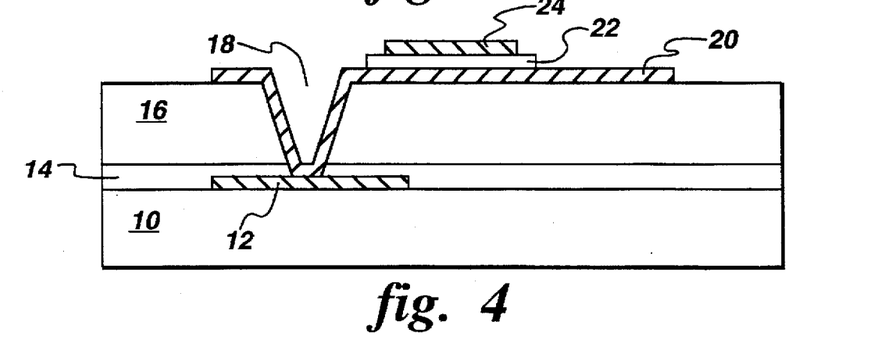
Figure 5A:
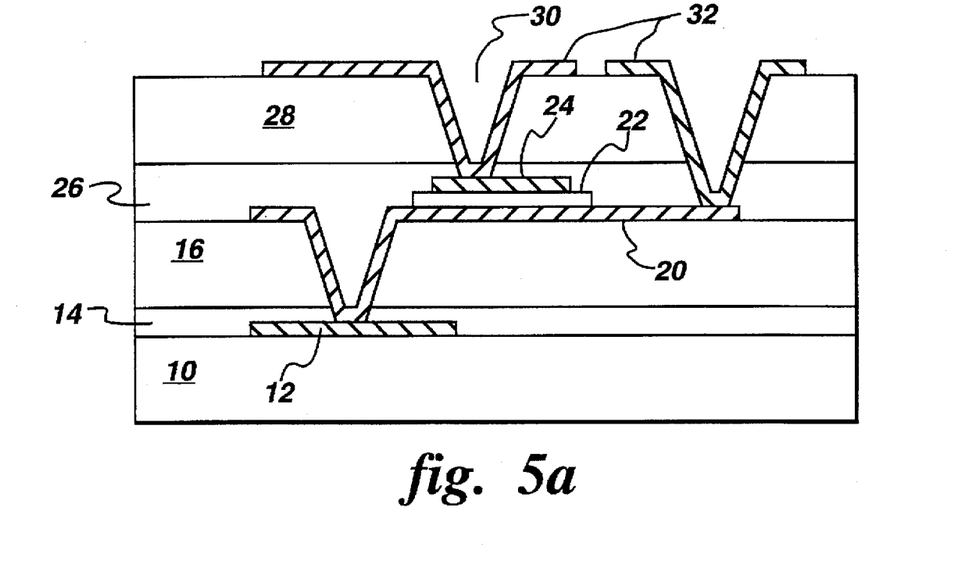
Figure 5B:
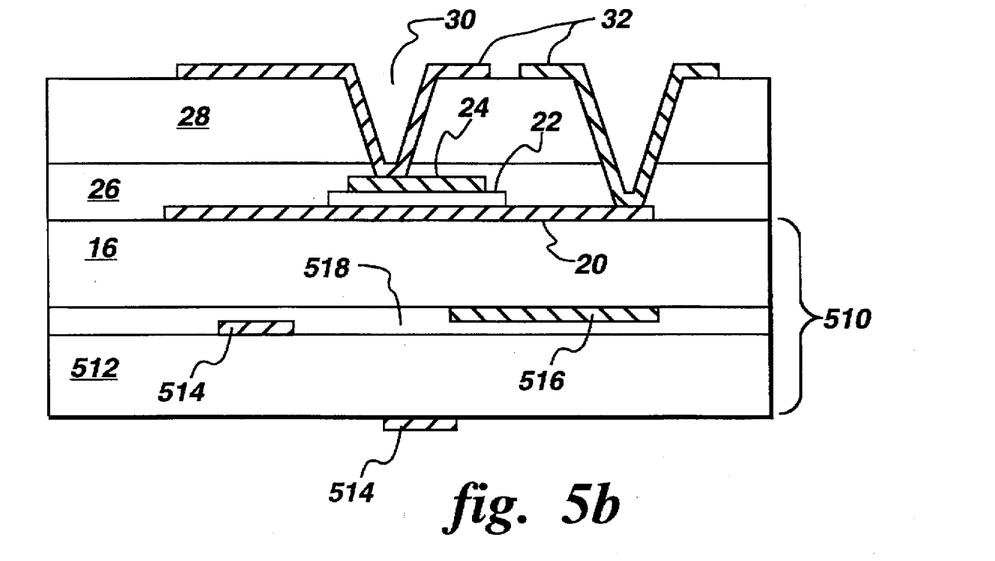

FIGS. 1–5b are views illustrating a process for fabricating an integral thin film capacitor on a base surface illustrated, for example, by a polymer layer 16. Although the embodiments of FIGS. 1–5a and 6–9 show an HDI interconnect circuit module and the embodiment of FIG. 5b shows a flexible interconnect layer wherein the base surface comprises a polymer layer, the capacitor of the present invention can be applied on a surface of any desired base material. Other materials such as ceramic substrates or printed circuit boards may be used as base surfaces, for example.

Figure 1:
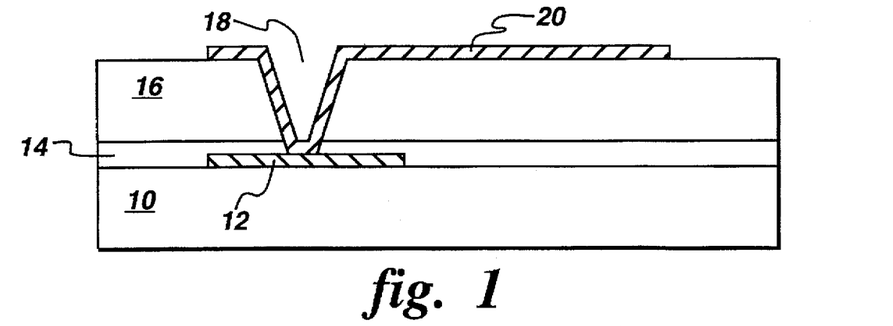

FIG. 1 is a sectional side view of a base metallization 12 of a substrate 10. Polymer layer 16 can be applied to substrate 10 with an optional adhesive layer 14.

Substrate 10 may comprise any suitable structural material such as a ceramic or a plastic, for example. In one embodiment, base metallization 12 comprises a plurality of layers such as titanium covered by copper covered by titanium, and polymer layer 16 comprises KAPTON™ polyimide (KAPTON is a trademark of E.I. du Pont and de Nemours Company) laminated to substrate 10 with adhesive 14 comprising ULTEM™ polyetherimide resin (ULTEM is a registered trademark of General Electric Co.) in a manner such as described in aforementioned U.S. Pat. No. 4,933,042. A via in polymer layer 16 extending to the base metallization can be formed by conventional laser techniques such as those described in Eichelberger et al., U.S. Pat. No. 4,894,115. Hereinafter "base metallization" will refer to any metallization layer 12 on substrate 10 and/or to chip pads of circuit chips in chip wells (shown in FIG. 7) of substrate 10. Base metallization is not required in the present invention.

A pattern of electrical conductors 20 can be applied to both interconnect base metallization and serve as a lower capacitor plate. In a preferred embodiment, a seed layer of about 1000 Å of titanium is sputtered for adhesion-promoting purposes, a layer of about 3,000 Å of copper is sputtered, a thicker layer of about 4 micrometers of copper is electroplated, and another layer of titanium having a thickness of about 1,000 Å is sputter deposited.

Regardless of the seed and electroplated materials used for the pattern of electrical conductors, having a thin layer of molybdenum as the outer surface of the pattern of electrical conductors has been found to aid in adhesion of a subsequently applied capacitor dielectric layer. The thickness of the molybdenum can be less than 100 Å and in one embodiment the molybdenum is sputtered to a thickness ranging from 60 Å to 100 Å.

Each metal of pattern of electrical conductors 20 can be patterned using conventional photoresist techniques. For example, the molybdenum can be etched at the same time as the underlying titanium in a $CF_4$/Ar reactive ion etching process; the copper can be etched with $FeCl_3$, and the seed layer of titanium can be etched using an HF solution.

Figure 2:
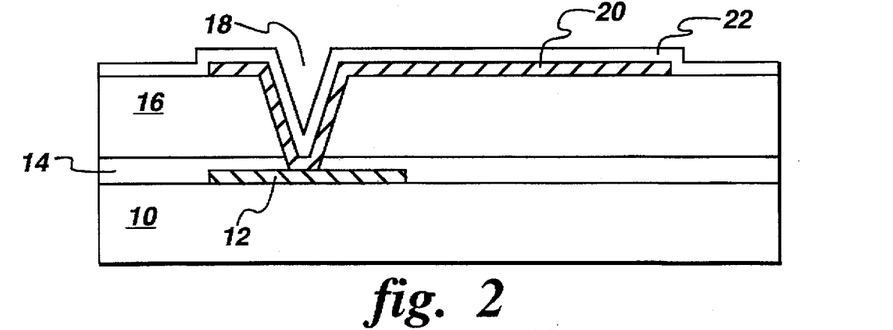

FIG. 2 is a view similar to that of FIG. 1 illustrating the addition of a DLC dielectric layer 22. The DLC layer can be deposited over the entire surface of the substrate 10 and pattern of electrical conductors 20 by a pressure-graded multi-step process using methylethylketone (MEK). MEK is an oxygen including organic precursor which has been shown to provide better adhesion than precursors which do not include oxygen.

One embodiment is a three step process. In the first step, 400 Å of "hard" DLC is deposited at a rate of 230 Å/min with a flow of 20 sccm (standard cubic centimeters per minute), a power of 50 W (watts) (DC bias −470 volts), and a pressure of 30 mtorr. In the second step, 1000 Å to 10,000 Å of "soft" DLC is deposited at a rate of 300 Å/min with a flow of 20 sccm, a power of 50 W (DC bias −110 volts), and a pressure of 500 mtorr. In the third step, 400 Å of "hard" DLC is deposited, in a similar manner as the first step, at a rate of 230 Å/min with a flow of 20 sccm, a power of 50 W (DC bias −470 volts), and a pressure of 30 mtorr.

The amount of ion bombardment is estimated by measuring the DC self bias voltage generated at the surface of the Rf powered electrode in the plasma reactor used for deposition. DLC deposited in the −100 volts to −300 volts bias range has the desired dielectric properties for thin film capacitor applications.

The bias voltage in a plasma discharge decreases as the reactor chamber pressure is increased. DLC deposited at low pressure (bias voltage having a magnitude greater than 300 volts) is more stressed and adheres better to underlying metallization, but, because such DLC is hard and relatively brittle, it cannot be deposited very thickly without cracking or peeling. Because of this, the bulk of the DLC layer 22 is deposited at a higher pressure (lower bias voltage). The DLC deposited at the higher pressure is softer and has good adhesion to the low pressure, hard DLC. A cap of the hard DLC is deposited on top of the soft DLC to provide protection and improved adhesion of a subsequently deposited pattern of electrical conductors for serving as the overlying capacitor metallization.

FIG. 3 is a view similar to that of FIG. 2 further illustrating the addition of an overlying pattern of electrical conductors 24 over DLC layer 22 and the underlying pattern of electrical conductors 20.

Overlying pattern 24 may comprise materials capable of adhesion to DLC and in one embodiment is applied by sputtering 1000 Å titanium, sputtering 3000 Å copper, and sputtering 1000 Å titanium. The overlying pattern is preferably sufficiently smooth and need not be as thick as those metallizations which are used for interconnection purposes. In fact, the overlying pattern is preferably kept thin so as to not create topography effects. The overlying pattern can be etched using the photoresist processes discussed above, with the underlying DLC layer being used to protect the underlying pattern of electrical conductors 20.

FIG. 4 is a view similar to that of FIG. 3 after DLC layer 22 has been patterned. The DLC layer can be patterned using conventional photoresist material and an oxygen plasma. The capacitor is complete after the DLC layer has been patterned.

FIG. 5a is a view similar to that of FIG. 4 illustrating an additional polymer layer 28 which can be laminated with an adhesive 26 over the capacitor. In one embodiment, polymer layer 28 comprises KAPTON polyimide. Vias 30 can be formed in the additional polymer layer to expose the underlying and overlying patterns of electrical conductors 20 and 24, respectively.

If the underlying pattern comprises titanium/copper/titanium, preferably the top layer of titanium is removed by a plasma technique, for example, prior to the application of an electrode-coupling pattern of electrical conductors 32. Electrode-coupling pattern of electrical conductors 32 can be applied and patterned in a similar manner as underlying pattern of electrical conductors 20.

FIG. 5b is a sectional side view similar to that of FIG. 5a except that, instead of resting on a substrate, polymer layer 16 overlies another polymer layer 512, and the two polymer layers form a flexible interconnect layer 510. The polymer layers may include respective metallization patterns 516 and 514 thereon, and in one embodiment the polymer layers are attached by an adhesive 518.

FIGS. 6–9 are views illustrating a process for fabricating an integral multi-layer thin film capacitor on a polymer layer using staggered via landing pads. This embodiment is particularly useful if a large capacitance is required on a small surface area.

Figure 6:
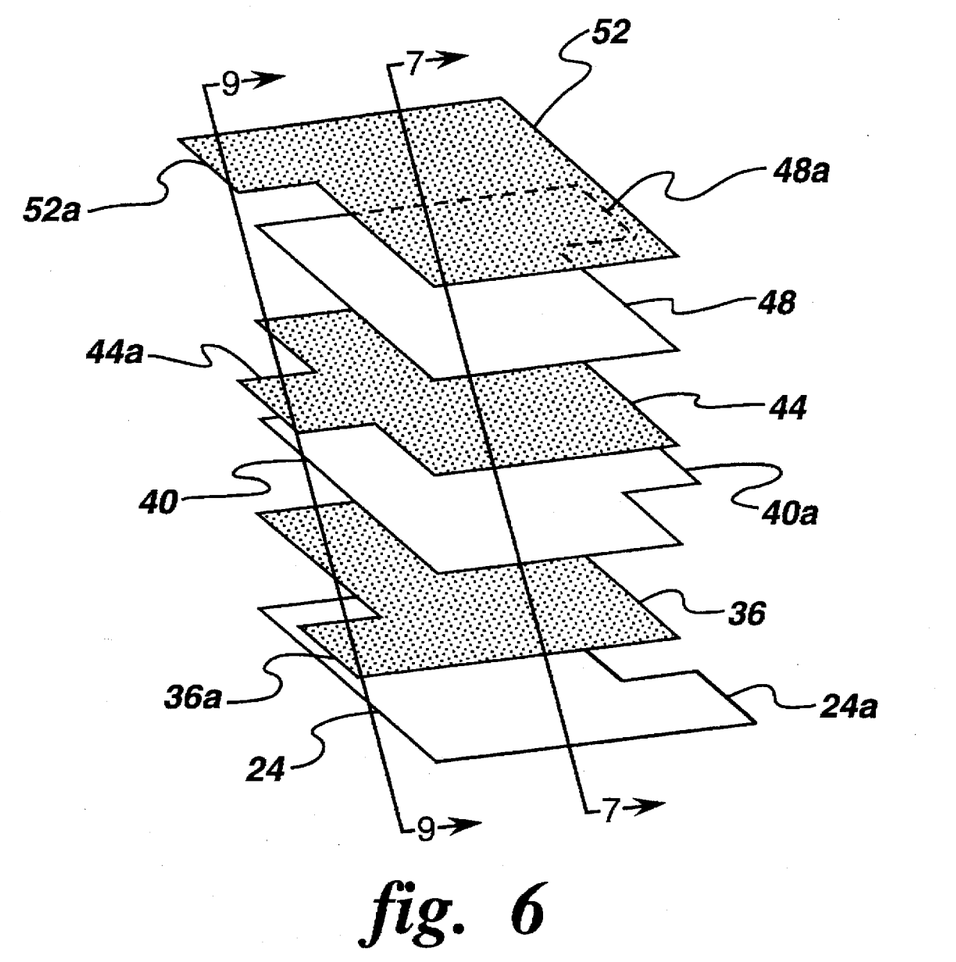
FIGS. 6–9 are views illustrating a process for fabricating an integral multi-layer thin film capacitor on a polymer layer using staggered via landing pads.

FIG. 6 is a perspective view of a plurality of capacitor plates 24, 36, 40, 44, 48, and 52. Each pattern of electrical conductors which forms a respective capacitor plate can be fabricated in the manner discussed above with respect to pattern of electrical conductors 24 with the addition of a thin layer of molybdenum (for adhesion purposes as discussed with respect to underlying pattern of electrical conductors 20) on the outer surface of those capacitor plates on which a DLC dielectric layer will rest. In the embodiment of FIG. 6, the capacitor plates are patterned to have staggered via landing pads 24a, 36a, 40a, 44a, 48a, and 52a so that vias can later be formed to the pads to interconnect alternating ones of the capacitor plates.

Figure 7:
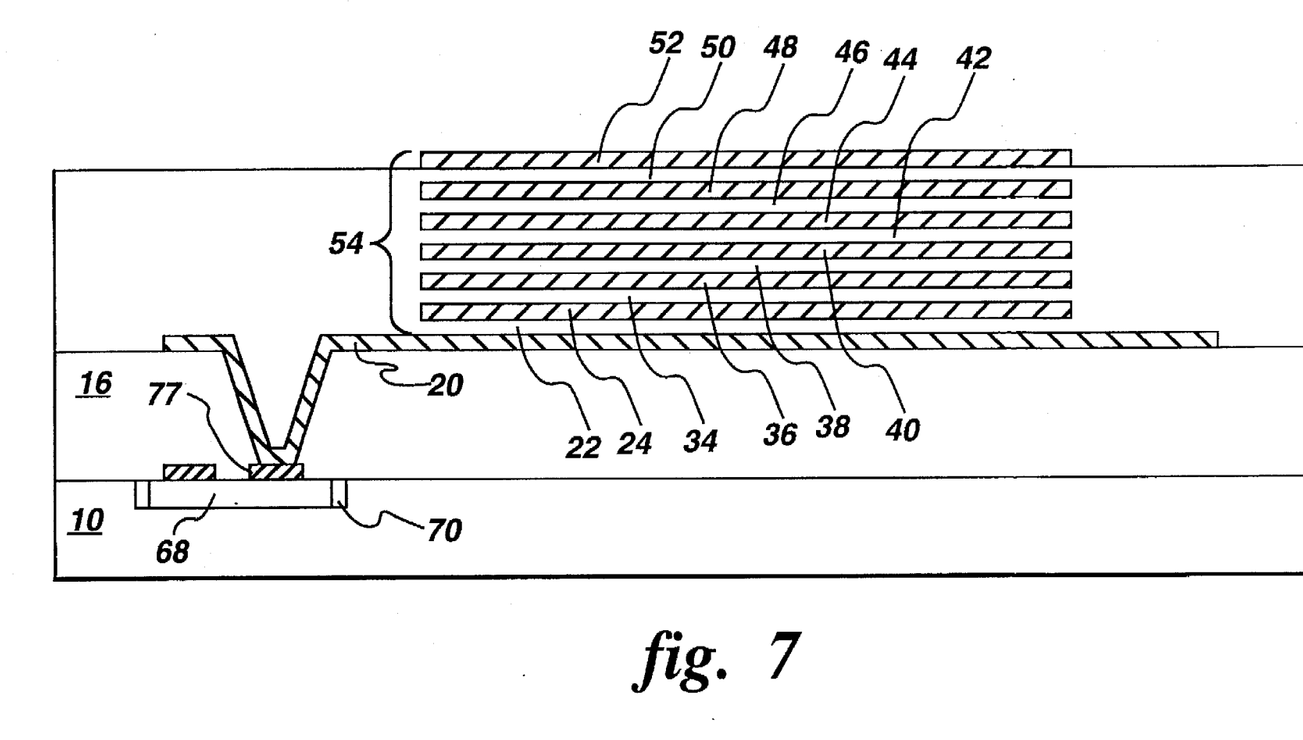
Figure 8:
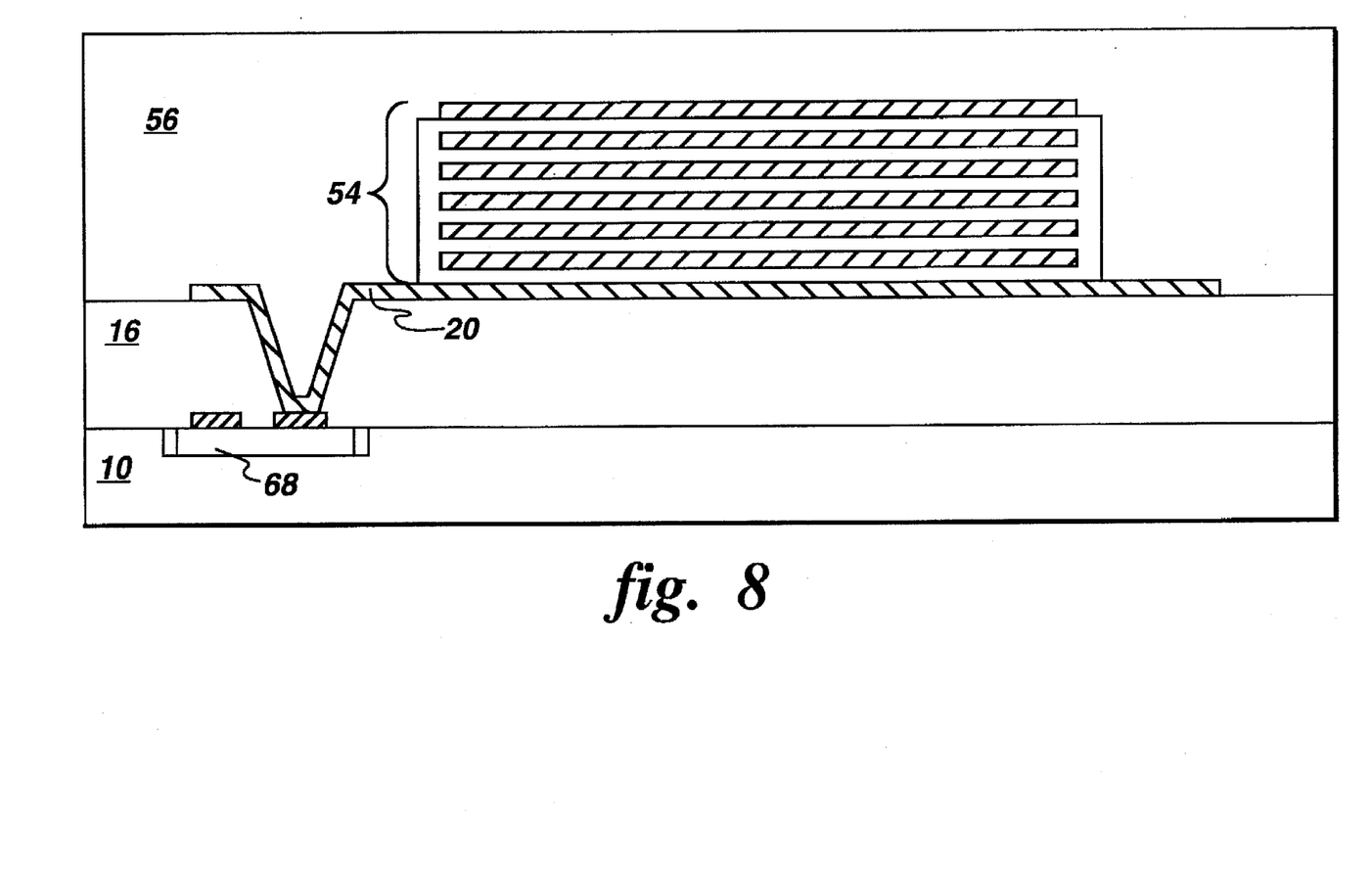
Figure 9:
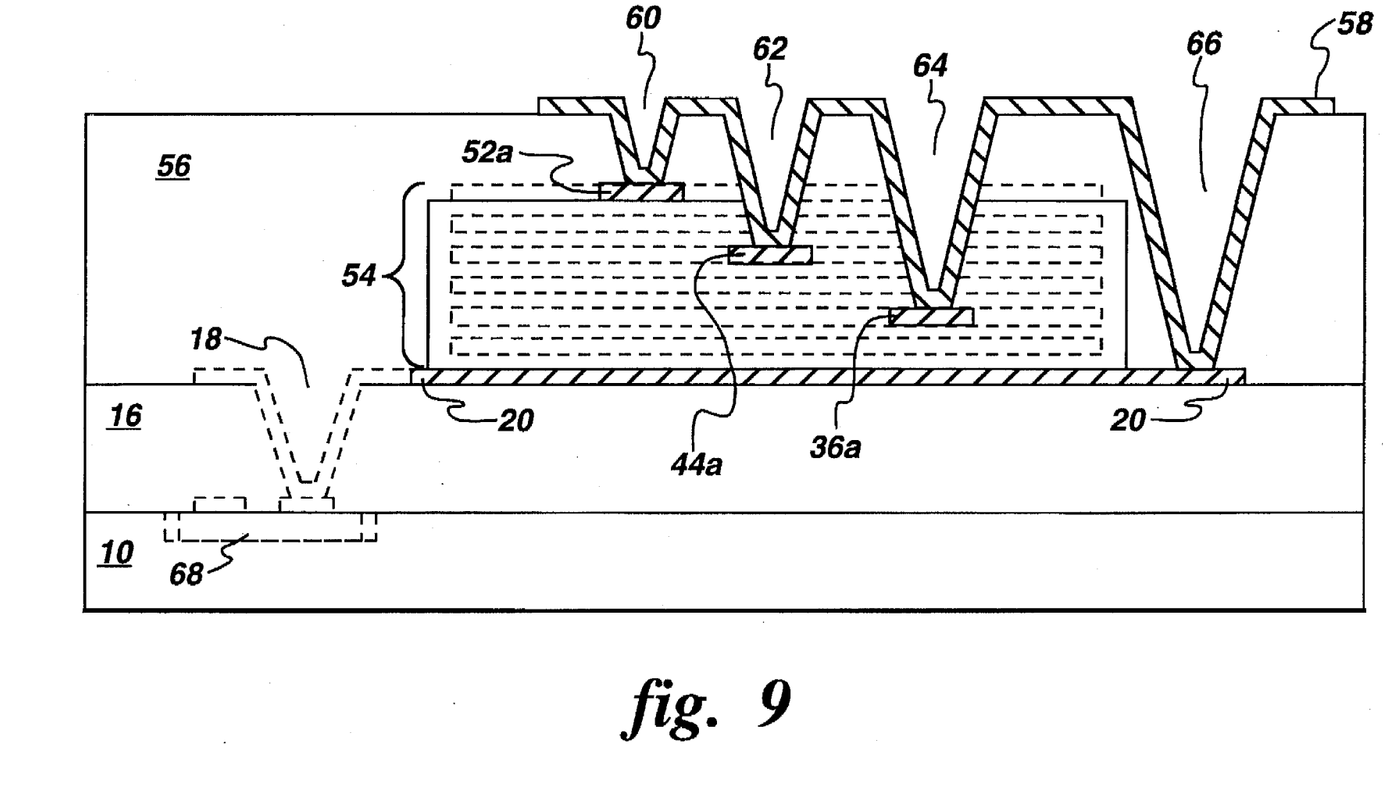

FIG. 7 is a sectional side view of a capacitor 54 overlying polymer layer 16. FIGS. 7–9 illustrate a circuit chip 68 having chip pads 77 and situated in a chip well 70 of substrate 10. The capacitor includes the underlying pattern of electrical conductors 20 (which is in contact with a chip pad 77), capacitor plates 24, 36, 40, 44, 48, and 52, and DLC dielectric layers 22, 34, 38, 42, 46, and 50.

Each capacitor plate can be applied and patterned prior to the application of an overlying DLC layer as discussed above using titanium, copper, titanium, and molybdenum. Each alternating layer of DLC can coat the entire underlying surface and need not be patterned individually. The DLC layers can be applied using the three step process discussed above, for example.

FIG. 8 is a view similar to that of FIG. 7 further showing capacitor 54 after the DLC layers have been patterned and an additional polymer layer 56 has been applied. The entire multilayer stack of DLC can be patterned and etched in one step using photoresist and oxygen plasma etching techniques. Additional polymer layer 56 can be laminated with an adhesive (not shown), for example. In one embodiment, the additional polymer layer comprises KAPTON polyimide and has a thickness of about 37 micrometers.

FIG. 9 is a view similar to that of FIG. 8 illustrating vias 60, 62, 64, and 66 extending respectively to landing pads 52a, 44a, and 36a, and underlying pattern of electrical conductors 20. In contrast to FIGS. 7 and 8 which illustrate portions of the capacitor plates represented along line 7-7' of FIG. 6, FIG. 9 illustrates portions of the landing pads along line 9-9' of FIG. 6 with the capacitor plates being represented by dotted lines in the background.

Vias can be formed through polymer layer 56 to the landing pads in the same manner as discussed with respect to via 18 in FIG. 1. The difference between via depths of the shallowest via 60 and the deepest via 66 is exaggerated in FIG. 9, and, in the embodiment using the specific materials and thicknesses discussed above, would only be about 3.3 micrometers.

While vias 60, 62, 64, and 66 are being formed, other vias (not shown) are formed to extend to the landing pads 24a, 44a, and 48a. Electrode-coupling pattern of electrical conductors 58 can be then be applied and patterned so that alternating ones of the capacitor plates are coupled.

Figure 10:
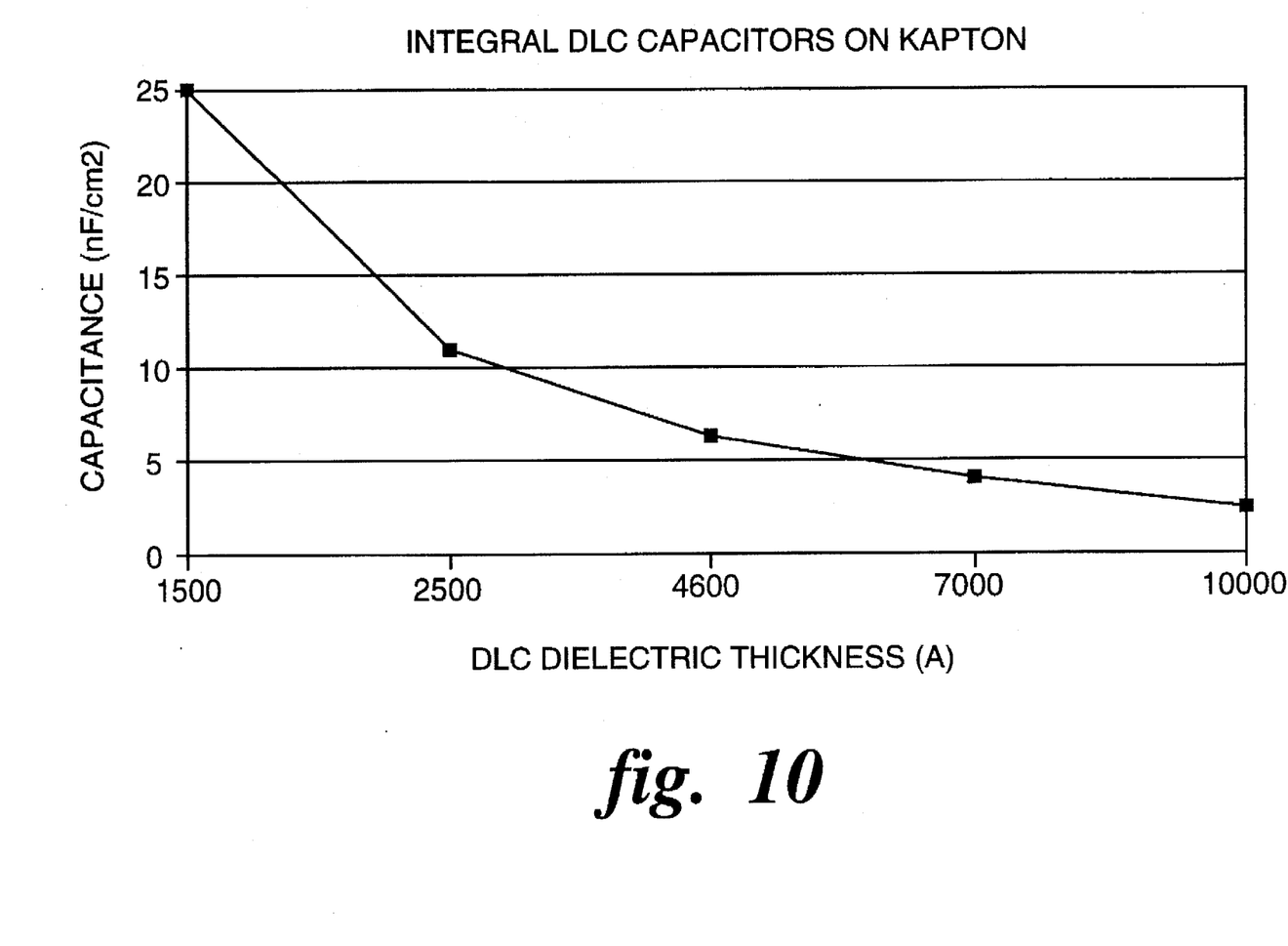
FIGS. 10–11 are graphs illustrating capacitance vs. capacitor dielectric thickness and voltage breakdown vs. capacitor dielectric thickness representative of experimental results.
Figure 11:
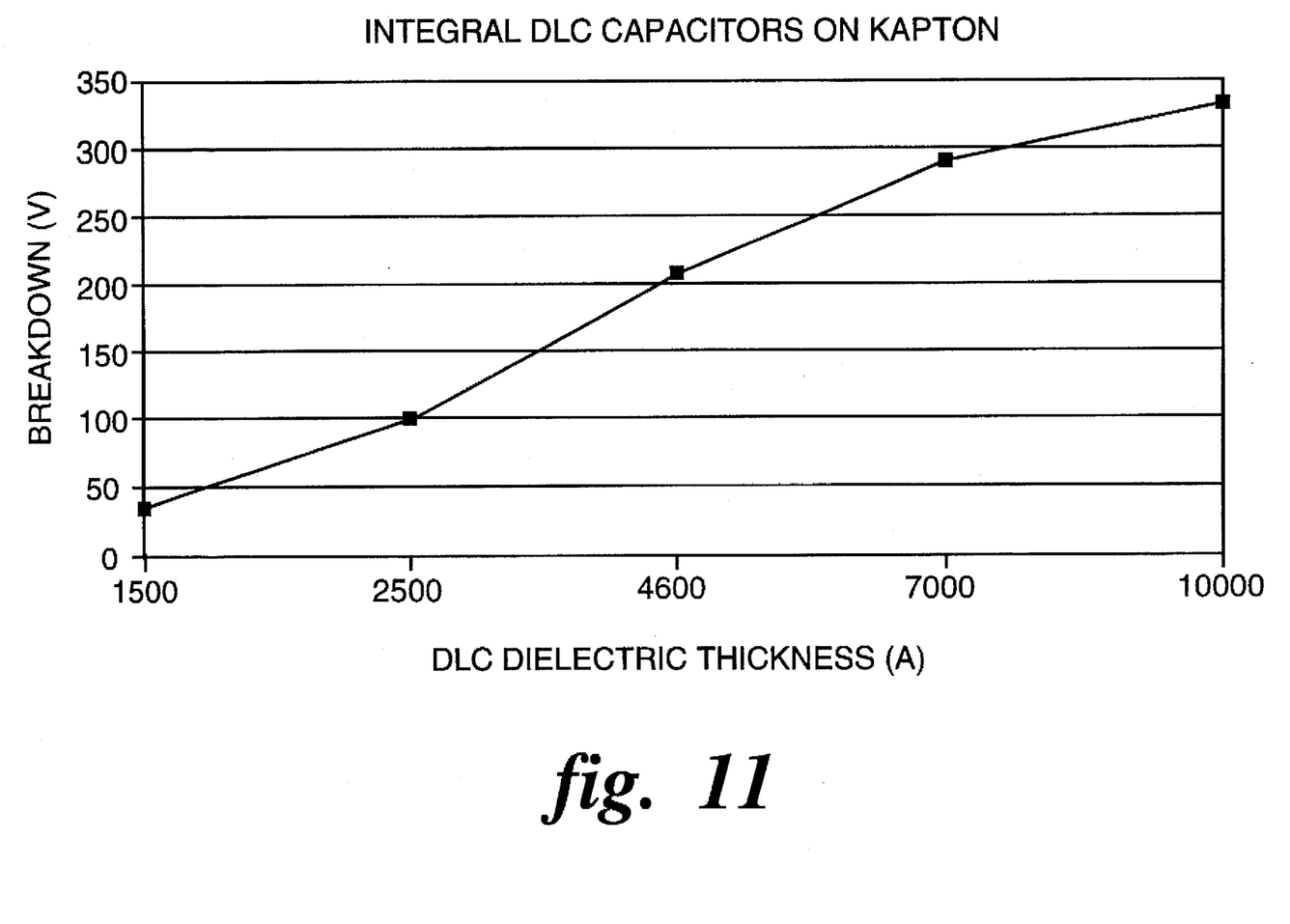

FIGS. 10-11 are graphs illustrating capacitance vs. dielectric thickness and voltage breakdown vs. dielectric thickness representative of experimental results. The process discussed above of using an MEK precursor and a hard/soft/hard graded DLC layer deposition technique was tested with DLC dielectric layers having various thicknesses (1500 Å, 2500 Å, 4600 Å, 7000 Å, and 10,000 Å) being fabricated on polyimide dielectric layers (specifically polyimides available from E.I. duPont de Nemours under the name KAPTON E polyimide and KAPTON H polyimide). The capacitors were subjected to 100 thermal cycles between −55° C. and +125° C. with no change in ratings.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for fabricating a capacitor on a base surface comprising:

applying a first pattern of electrical conductors over the base surface, an outer surface of the first pattern of electrical conductors comprising molybdenum, the first pattern of electrical conductors comprising a first capacitor plate;

depositing a first hard portion of a capacitor dielectric layer comprising amorphous hydrogenated carbon over the first capacitor plate and the base surface;

depositing a soft portion of the capacitor dielectric layer over the first hard portion;

depositing a second hard portion of the capacitor dielectric layer over the soft portion, the step of depositing the soft portion occurring at a lower bias voltage than the steps of depositing the first and second hard portions;

applying a second pattern of electrical conductors over the capacitor dielectric layer, the second pattern of electrical conductors comprising a second capacitor plate;

patterning the capacitor dielectric layer;

applying a polymer layer over the first and second capacitor plates;

forming two vias, a first via extending to the first capacitor plate and a second via extending to the second capacitor plate; and applying an electrode-coupling pattern of electrical conductors over the polymer layer, a first portion of the electrode-coupling pattern of electrical conductors extending into the first via and a second portion of the electrode-coupling pattern of electrical conductors extending into the second via.

2. The method of claim 1, wherein the step of depositing the capacitor dielectric layer incudes using an organic precursor including oxygen.

3. The method of claim 1, wherein the step of depositing the capacitor dielectric layer includes using a methylethylketone precursor.

4. A method of fabricating a multilayer capacitor on a base surface, comprising the steps of:

applying a first pattern of electrical conductors over the base surface, an outer surface of the first pattern of electrical conductors comprising molybdenum;

depositing a plurality of capacitor dielectric layers on the first pattern of electrical conductors alternately with a plurality of additional patterns of electrical conductors, each capacitor dielectric layer comprising amorphous hydrogenated carbon, the first pattern of electrical conductors and the additional patterns of electrical conductors comprising a plurality of capacitor plates, the step of depositing a plurality of capacitor dielectric layers, including, for each capacitor dielectric layer, depositing a first hard portion of the capacitor dielectric layer over an underlying capacitor plate, depositing a soft portion of the capacitor dielectric layer over the first hard portion, and depositing a second hard portion of the capacitor dielectric layer over the soft portion, the step of depositing the soft portion occurring at a lower bias voltage than the steps of depositing the first and second hard portions;

patterning the plurality of capacitor dielectric layers;

applying a polymer layer over the plurality of capacitor plates and the plurality of capacitor dielectric layers;

forming a plurality of vias, each via extending to a respective one of the plurality of capacitor plates; and applying an electrode-coupling pattern of electrical conductors over the polymer layer, a first portion of the electrode-coupling pattern of electrical conductors extending into selected ones of the plurality of vias to couple alternating ones of the plurality of capacitor plates and a second portion of the electrode-coupling pattern of electrical conductors extending into selected other ones of the plurality of vias.

5. The method of claim 4, wherein depositing each capacitor dielectric layer incudes using an organic precursor including oxygen.

6. The method of claim 4, wherein depositing each capacitor dielectric layer includes using a methylethylketone precursor.

7. The method of claim 4, wherein depositing the plurality of capacitor dielectric layers on the first pattern of electrical conductors alternately with the plurality of additional patterns of electrical conductors, includes depositing each of at least some of the plurality of additional patterns of electrical conductors by the steps of depositing a layer of electrically conductive material and patterning the layer of electrically conductive material to form a capacitor plate having a staggered via landing pad.

* * * * *